(12) United States Patent
Huang

(10) Patent No.: US 12,387,770 B2
(45) Date of Patent: Aug. 12, 2025

(54) SIGNAL SAMPLING CIRCUIT AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 260 days.

(21) Appl. No.: 18/177,092

(22) Filed: Mar. 1, 2023

(65) Prior Publication Data

US 2023/0307023 A1    Sep. 28, 2023

(30) Foreign Application Priority Data

Mar. 23, 2022    (CN) .......................... 202210294845.0

(51) Int. Cl.
*G11C 11/408*  (2006.01)
*G11C 7/10*  (2006.01)
(Continued)

(52) U.S. Cl.
CPC .............. *G11C 7/222* (2013.01); *G11C 7/109* (2013.01); *G11C 7/1093* (2013.01); *G11C 7/225* (2013.01);
(Continued)

(58) Field of Classification Search
CPC ..... G11C 7/222; G11C 7/225; G11C 11/2293; G11C 11/4076; G11C 7/1093;
(Continued)

(56) References Cited

U.S. PATENT DOCUMENTS

| 5,912,858 A | 6/1999 | Tomita |
| 9,088,287 B2 | 7/2015 | Choi |

(Continued)

FOREIGN PATENT DOCUMENTS

| CN | 1820322 A | 8/2006 |
| CN | 103093805 A | 5/2013 |

(Continued)

OTHER PUBLICATIONS

International Search Report in the international application No. PCT/CN2022/091111, mailed on Dec. 15, 2022.

(Continued)

*Primary Examiner* — Amir Zarabian
*Assistant Examiner* — Justin Bryce Heisterkamp
(74) *Attorney, Agent, or Firm* — Syncoda LLC; Feng Ma

(57) ABSTRACT

A signal sampling circuit includes the following. An input sampling circuit samples a first chip select signal and a first command address signal according to a first clock signal to obtain a second chip select signal and a second command address signal. A second command address signal includes an initial command signal. The logical operation circuit performs logical operation on the first clock signal and the second chip select signal to obtain a chip select clock signal. A instruction decoding circuit decodes and samples the initial instruction signal according to the chip select clock signal and the second chip select signal to obtain a target instruction signal. An output combination circuit samples and performs output combination on the second command address signal according to the chip select clock signal to obtain a target address signal.

10 Claims, 8 Drawing Sheets

(51) Int. Cl.
*G11C 7/22* (2006.01)
*G11C 8/06* (2006.01)
*G11C 11/22* (2006.01)
*G11C 11/4076* (2006.01)
*G11C 29/12* (2006.01)
*G11C 8/12* (2006.01)

(52) U.S. Cl.
CPC ............ *G11C 8/06* (2013.01); *G11C 11/2293* (2013.01); *G11C 11/4076* (2013.01); *G11C 11/408* (2013.01); *G11C 29/12015* (2013.01); *G11C 8/12* (2013.01)

(58) Field of Classification Search
CPC ... G11C 29/12015; G11C 11/408; G11C 7/22; G11C 8/12; G11C 7/109; G11C 11/4093; G11C 8/06; G11C 29/14
See application file for complete search history.

(56) References Cited

U.S. PATENT DOCUMENTS

| | | | |
|---|---|---|---|
| 10,063,234 | B1 | 8/2018 | Mazumder |
| 10,176,858 | B1* | 1/2019 | Wilmoth ................ G11C 7/109 |
| 10,254,782 | B2 | 4/2019 | He |
| 10,354,704 | B2* | 7/2019 | Jung .................... G11C 7/1084 |
| 10,403,335 | B1* | 9/2019 | Uemura .................... G11C 7/22 |
| 10,438,650 | B1* | 10/2019 | Yamashita .......... G11C 11/4082 |
| 10,679,683 | B1 | 6/2020 | Chen |
| 10,896,703 | B2* | 1/2021 | Smith .................... G11C 7/222 |
| 11,605,408 | B1* | 3/2023 | Sreeram ............... G11C 7/1096 |
| 2005/0007836 | A1 | 1/2005 | Morzano |
| 2005/0254336 | A1 | 11/2005 | Morzano |
| 2008/0056057 | A1 | 3/2008 | Kim |
| 2008/0181031 | A1 | 7/2008 | Morzano |
| 2009/0323436 | A1* | 12/2009 | Lee ...................... G11C 11/406 365/189.11 |
| 2013/0077427 | A1* | 3/2013 | Kondo .................... G11C 8/18 365/230.06 |
| 2013/0114358 | A1 | 5/2013 | Chu |
| 2013/0249608 | A1 | 9/2013 | Song |
| 2014/0253188 | A1 | 9/2014 | Choi et al. |
| 2015/0380069 | A1* | 12/2015 | Matsui ................... G11C 7/222 365/191 |
| 2016/0064057 | A1* | 3/2016 | Lee .......................... G11C 8/06 365/233.11 |
| 2017/0110165 | A1 | 4/2017 | Kim et al. |
| 2018/0059764 | A1 | 3/2018 | He |
| 2018/0102150 | A1* | 4/2018 | Choi .................... G11C 29/028 |
| 2018/0122486 | A1* | 5/2018 | Choi .................... G11C 29/028 |
| 2018/0293025 | A1* | 10/2018 | Sakai .................... G06F 3/0659 |
| 2019/0180803 | A1 | 6/2019 | Jung et al. |
| 2019/0392886 | A1 | 12/2019 | Cox et al. |
| 2020/0005857 | A1 | 1/2020 | Ito et al. |
| 2020/0176050 | A1 | 6/2020 | Ito et al. |
| 2021/0020224 | A1 | 1/2021 | Cox et al. |
| 2021/0090624 | A1* | 3/2021 | Kim ................ G11C 29/50012 |
| 2022/0020408 | A1* | 1/2022 | Kim .................... G11C 11/4076 |
| 2022/0069825 | A1 | 3/2022 | Kim |
| 2022/0130433 | A1* | 4/2022 | Kwak .................... G11C 7/222 |
| 2022/0208255 | A1* | 6/2022 | Mori .................... G11C 7/1093 |
| 2023/0017682 | A1* | 1/2023 | Huang ..................... G11C 7/06 |
| 2023/0162775 | A1* | 5/2023 | Kim ................ G11C 11/40611 365/222 |
| 2023/0386553 | A1* | 11/2023 | Huang ................ G11C 11/4072 |

FOREIGN PATENT DOCUMENTS

| | | |
|---|---|---|
| CN | 104348468 A | 2/2015 |
| CN | 109584944 A | 4/2019 |
| CN | 109791786 A | 5/2019 |
| CN | 109903793 A | 6/2019 |
| CN | 110574111 A | 12/2019 |
| CN | 112486312 A | 3/2021 |
| CN | 112802537 A | 5/2021 |
| CN | 114115442 A | 3/2022 |
| IN | 108347245 A | 7/2018 |
| JP | 2003179587 A | 6/2003 |
| KR | 100800483 B1 | 2/2008 |

OTHER PUBLICATIONS

International Search Report in the international application No. PCT/CN2022/091428, mailed on Dec. 16, 2022.
International Search Report in the international application No. PCT/CN2022/089853, mailed on Dec. 16, 2022.
International Search Report in the international application No. PCT/CN2022/098889, mailed on Dec. 19, 2022.
International Search Report in the international application No. PCT/CN2022/099265, mailed on Dec. 7, 2022.

* cited by examiner (a)　　　　　(b)

SIGNAL SAMPLING CIRCUIT AND SEMICONDUCTOR MEMORY

CROSS-REFERENCE TO RELATED APPLICATION

This application claims priority to Chinese Patent Application No. 202210294845.0 filed on Mar. 23, 2022, the disclosure of which is hereby incorporated by reference in its entirety.

BACKGROUND

With the continuous development of semiconductor technologies, people put forward higher and higher requirements for a data transmission speed when manufacturing and using computers and other devices. In order to obtain a faster data transmission speed, a series of devices, such as memories, for transmitting data at a Double Data Rate (DDR) have been developed.

In a Dynamic Random Access Memory (DRAM), Command/Address (CMD/ADD or CA) signals can be sampled as addresses, and can also be sampled and decoded as instructions. In this way, after the CA signal is sampled, since the instruction still needs to be decoded, the instruction path additionally has a logical circuit for decoding than the address path, resulting in a large timing deviation when the instruction signal and the address signal reach the next-stage functional module. Thus, a problem in the next-stage functional module may be caused due to the timing deviation.

SUMMARY

The disclosure relates to the technical field of integrated circuits, and in particular to a signal sampling circuit and a semiconductor memory.

In a first aspect, the embodiments of the present disclosure provides a signal sampling circuit, which includes an input sampling circuit, a logical operation circuit, an instruction decoding circuit and an output combination circuit. The input sampling circuit is configured to sample, according to a first clock signal, a first chip select signal and a first command address signal respectively to obtain a second chip select signal and a second command address signal. The second command address signal includes an initial instruction signal. The logical operation circuit is configured to perform logical operation on the first clock signal and the second chip select signal to obtain a chip select clock signal. The instruction decoding circuit is configured to decode and sample, according to the chip select clock signal and the second chip select signal, the initial instruction signal to obtain a target instruction signal. The output combination circuit is configured to sample and perform output combination on the second command address signal according to the chip select clock signal to obtain a target address signal.

In a second aspect, the embodiments of the present disclosure provide a semiconductor memory including an input sampling circuit, a logical operation circuit, an instruction decoding circuit and an output combination circuit. The input sampling circuit is configured to sample, according to a first clock signal, a first chip select signal and a first command address signal respectively to obtain a second chip select signal and a second command address signal. The second command address signal includes an initial instruction signal. The logical operation circuit is configured to perform logical operation on the first clock signal and the second chip select signal to obtain a chip select clock signal. The instruction decoding circuit is configured to decode and sample, according to the chip select clock signal and the second chip select signal, the initial instruction signal to obtain a target instruction signal. The output combination circuit is configured to sample and perform output combination on the second command address signal according to the chip select clock signal to obtain a target address signal.

DETAILED DESCRIPTION

The technical solution in the embodiments of the present disclosure will be clearly and completely described below in conjunction with the figures in the embodiments of the present disclosure. It is to be understood that the specific embodiments described herein are intended only to explain the relevant application and not to limit the application. In addition, it should be noted that, for ease of description, only portions related to the application are shown in the figures.

Unless otherwise defined, all technical and scientific terms used herein have the same meanings as commonly understood by those skilled in the art of the present disclosure. The terminology used herein is for the purpose of describing the embodiments of the present disclosure only, and is not intended to limit the present disclosure.

In the following description, the term "some embodiments" is referenced to describe a subset of all possible embodiments. However, it is understood that "some embodiments" may be the same subset or different subsets of all possible embodiments, and may be combined with each other without conflict.

It should be pointed out that, the term "first/second/third" involved in embodiments of the present disclosure is only to distinguish similar objects, and does not represent a specific order of objects. It is understood that the "first/second/third" may be interchanged in a specific order or sequence, where permitted, to enable the embodiments of the disclosure described herein to be implemented in an order other than that is illustrated or described herein.

The following is an explanation of the technical terms and the correspondence of some nouns involved in the embodiments of the present disclosure:

Dynamic Random Access Memory (DRAM)
Synchronous Dynamic Random Access Memory (SDRAM)
Double Data Rate (DDR)
Fourth generation DDR (4th DDR, DDR4)
Fifth generation DDR (5th DDR, DDR5)
Command Address Input (Command/Address, CMD/ADD or CA for short)
Clock Input (CLK)
Chip Select Input (CS)
Buffer/Repeater (RPT)
Command Decoder (CMD DEC)
D-type flip-flop (Data Flip-Flop or Delay Flip-Flop, DFF)
Process, Voltage, Temperature (PVT)

Understandably, taking a DDR5 DRAM design as an example, a CA input may be sampled as an address, and may also be sampled and decoded as an instruction. The CA here is a general name for various command address signals of DRAM, which may include command signals such as a row address strobe (RAS), a column address strobe (CAS), a write (WE), an active (ACT), and may also include address signals of A13 to A0. In addition, in practical applications, the number of bits in the address signal contained in the command address signal may be specifically determined according to specifications of the DRAM, and no limitation is made in the embodiments of the present disclosure.

Figure 1:
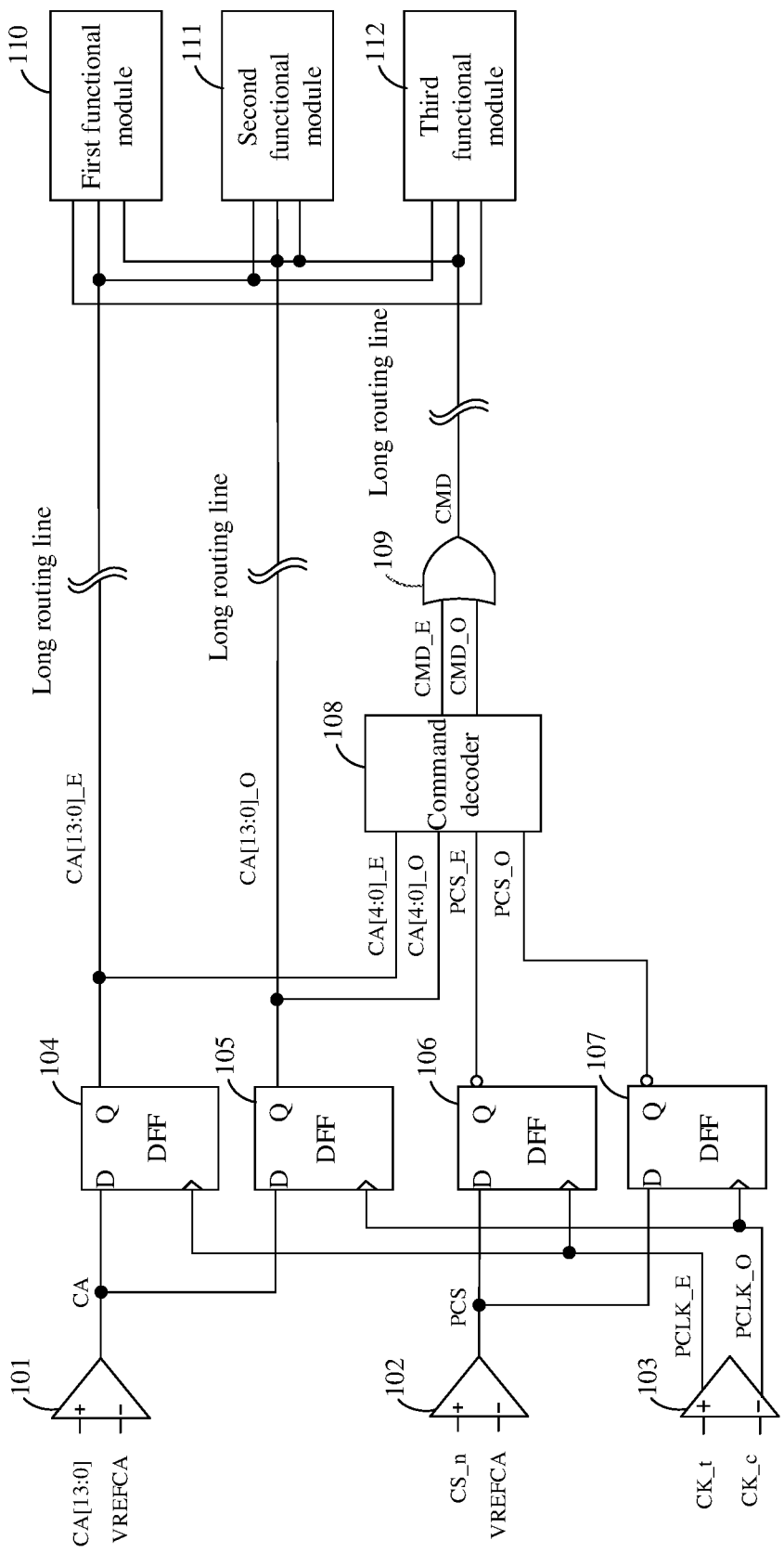
FIG. 1 illustrates a schematic diagram of a composition structure of a signal sampling circuit.
Figure 2:
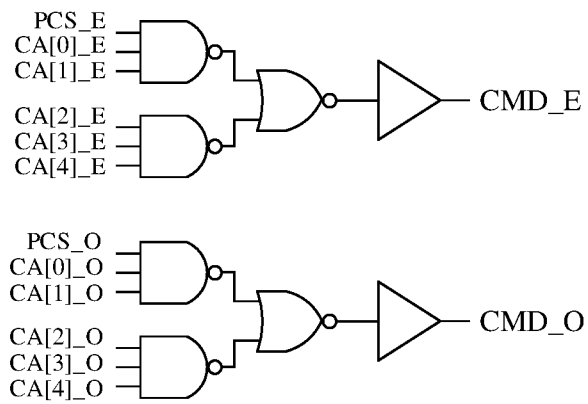
FIG. 2 illustrates a schematic diagram of a composition structure of a command decoder.

Exemplarily, referring to FIG. 1, FIG. 1 illustrates a schematic diagram of a composition structure of a signal sampling circuit. As illustrated in FIG. 1, the signal sampling circuit includes a first receiver 101, a second receiver 102, a third receiver 103, a first sampling circuit 104, a second sampling circuit 105, a third sampling circuit 106, a fourth sampling circuit 107, a command decoder 108, an OR gate 109, a first functional module 110, a second functional module 111, and a third functional module 112. Each of the first sampling circuit 104 and the second sampling circuit 105 may be composed of a D-type flip-flop, and each of the third sampling circuit 106 and the fourth sampling circuit 107 may be composed of a D-type flip-flop and an inverter. In addition, the command decoder 108 (denoted by CMD DEC) may be composed of logical components, such as a three-input NAND gate, a two-input NOR gate, and a buffer, as illustrated in detail in FIG. 2.

In FIG. 1, input signals of the first receiver 101 are an initial command address signal (denoted by CA[13:0]) and a reference signal (denoted by VREFCA), and an output signal of the first receiver 101 is a first command address signal (CA). Input signals of the second receiver 102 are an initial chip select signal (denoted by CS_n) and a reference signal (denoted by VREFCA), and an output signal of the second receiver 102 is a first chip select signal (denoted by PCS). Input signals of the third receiver 103 are a pair of input clock signals complementary to each other (denoted by CK_t and CK_c), and output signals of the third receiver 103 are a first clock even signal (denoted by PCLK_E) and a first clock odd signal (denoted by PCLK_O). Then, through the first sampling circuit 104, the first command address signal is sampled by using the first clock even signal to obtain a target address even signal (denoted by CA[13:0]_E), and the target address even signal includes an initial instruction even signal (denoted by CA[4:0]_E). Through the second sampling circuit 105, the first command address signal is sampled by using the first clock odd signal to obtain a target address odd signal (denoted by CA[13:0]_O), and the target address odd signal includes an initial instruction odd signal (denoted by CA[4:0]_O). Through the third sampling circuit 106, the first chip select signal is sampled and inverted by using the first clock even signal to obtain a second chip select signal (denoted by PCS_E). Through the fourth sampling circuit 107, the first chip select signal is sampled and inverted by using the first clock odd signal to obtain the second chip select odd signal (denoted by PCS_O). Then, signals CA[4:0]_E, CA[4:0]_O, PCS_E and PCS_O are decoded by the command decoder 108 to obtain an instruction even signal (denoted by CMD_E) and an instruction odd signal (denoted by CMD_O). Finally, through the OR gate 109, an "or" logical operation is performed on signals CMD_E and CMD_O to obtain a target instruction signal (denoted by a CMD). In addition, there is long routing line from the target instruction signal, the target address even signal and the target address odd signal to the first functional module 110, the second functional module 111 and the third functional module 112. In this way, the target instruction signal, the target address even signal and the target address odd signal will jointly reach different functional modules (e.g., the first functional module 110, the second functional module 111 and the third functional module 112,) after passing through different layout wiring paths to realize a next-stage function. It should be noted that, CA[13:0] here represents a set of signals of CA[0], CA[1], . . . , CA[13]. Correspondingly, the first receiver 101 actually includes 14 receiving circuits and output lines, even including the following sampling circuits; and there are 14 long routing lines corresponding to CA[0], CA[1], . . . , CA[13] one by one.

Figure 3:
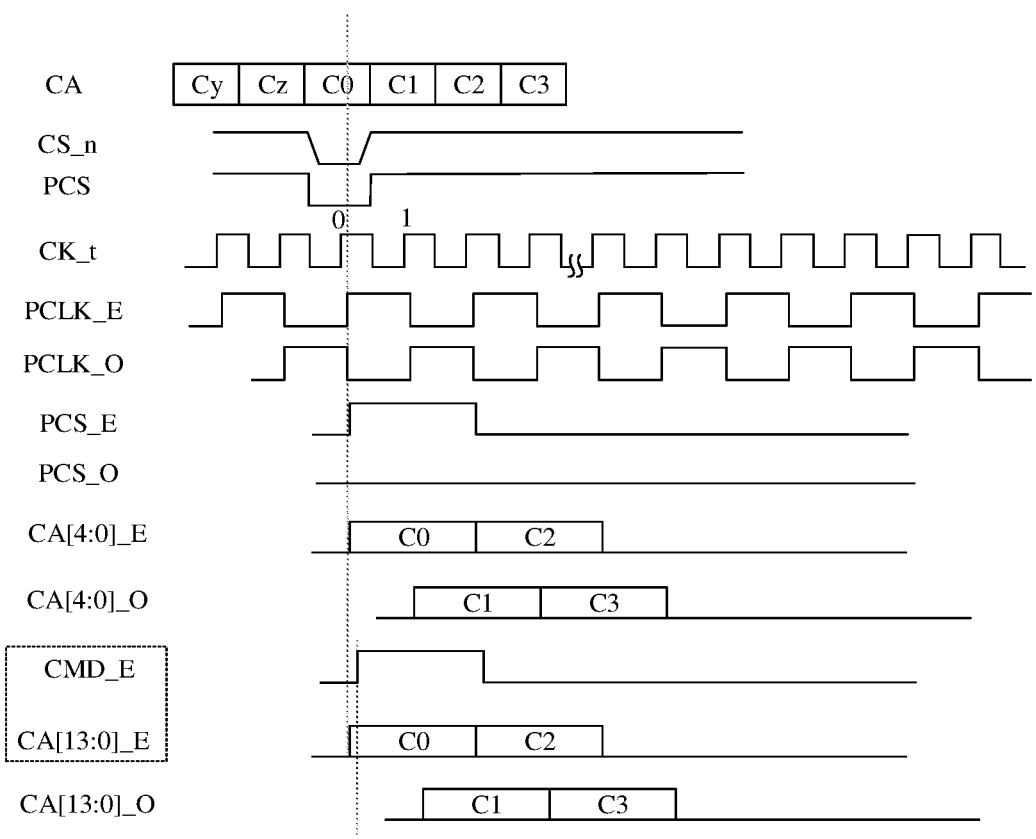
FIG. 3 illustrates a schematic diagram of signal timing of a signal sampling circuit.

Based on the signal sampling circuit illustrated in FIG. 1, a corresponding signal timing diagram is as illustrated in FIG. 3. In FIG. 3, the initial clock signal is denoted by CK_t, the first clock even signal is denoted by PCLK_E, and the first clock odd signal is denoted by PCLK_O. A clock cycle of the CK_t signal is a preset clock cycle, and clock cycles of the PCLK_E signal and the PCLK_O signal are both twice the preset clock cycle. The first command address signal is denoted by CA, and the CA signal may include Cy, Cz, C0, C1, C2, and C3. The initial chip select signal is denoted by CS_n, and the first chip select signal is denoted by PCS. The PCS signal is a pulse signal that is active at a low level and has a pulse width being the preset clock cycle. The PCS signal indicates that a target chip is selected. The second chip select even signal obtained after sampling and inverting the PCS signal using a rising edge of the PCLK_E signal is denoted by PCS_E, which is a pulse signal that is active at a high level and has a pulse width being twice of the preset clock cycle. The second chip select odd signal obtained after sampling and inverting the PCS signal using a rising edge of PCLK_O signal is denoted by PCS_O, which is a low-level signal. After the CA signal is sampled using the rising edge of PCLK_E signal, the obtained target address even signal is denoted by CA[13:0]_E and the obtained initial instruction even signal is denoted by CA[4:0]_E. After the CA signal is sampled by using the rising edge of PCLK_O signal, the obtained target address odd signal is denoted by CA[13:0]_O and the obtained initial instruction odd signal is denoted by CA[4:0]_O. Since the PCS_O signal is a low-level signal, the instruction odd signal obtained by decoding is denoted by CMD_O, and the CMD_O signal is also a low-level signal. Only the instruction even signal obtained after decoding the PCS_E signal and the CA[4:0]_E signal is denoted by CMD_E, and the CMD_E signal is a pulse signal that is active at a high level and has a pulse width being twice the preset clock cycle. However, after the delay caused by logical circuits, such as instruction decoding circuit, there is a timing deviation between a finally sampled CA[13:0]_E signal and the CMD_E signal.

In short, a frequency division is performed on the CK_t/CK_c signal through the third receiver 103 to obtain the PCLK_E signal and the PCLK_O signal, and then, the CA signal is sampled. After sampling the CA signal, since the instruction signal has to be decoded, the instruction path has logical circuits such as the command decoder 108 and the OR gate 109) additionally than the address path. The signals in the instruction path jointly reach different functional modules after passing through different layout wiring paths to realize the next-stage function. However, after being sampled in the same clock cycle, the PCS_E signal and the CA[4:0]_E signal will be output in an aligned manner. However, due to the additional logical circuits in the instruction path than the address path, the CMD_E signal and the CA[13:0]_E signal have a large deviation (Skew) when reaching the next stage. This Skew is different under different PVT conditions, which may lead to an error in the next-stage function due to the timing deviation.

Based on this, the embodiments of the present disclosure provide a signal sampling circuit, which includes an input sampling circuit, a logical operation circuit, an instruction decoding circuit and an output combination circuit. The input sampling circuit is configured to sample, according to a first clock signal, a first chip select signal and a first command address signal respectively to obtain a second chip select signal and a second command address signal. The second command address signal includes an initial command signal. The logical operation circuit is configured to perform logical operation on the first clock signal and the second chip select signal, to obtain a chip select clock signal. The instruction decoding circuit is configured to decode and sample, according to the chip select clock signal and the second chip select signal, the initial instruction signal to obtain a target instruction signal. The output combination circuit is configured to sample and perform output combination on the second command address signal according to the chip select clock signal, to obtain a target address signal. There is timing alignment between the target address signal and the target instruction signal. In this way, based on the signal sampling circuit, the timing alignment between the target instruction signal and the target address signal can be realized under the sampling in the same clock cycle, so that there is no deviation that changes as a function of the PVT between the decoded instruction signal and the address signal. Thus, the problem of the next-stage functional module caused by the timing deviation can be avoided.

The embodiments of the present disclosure may be described in detail below with reference to the drawings.

Figure 4:
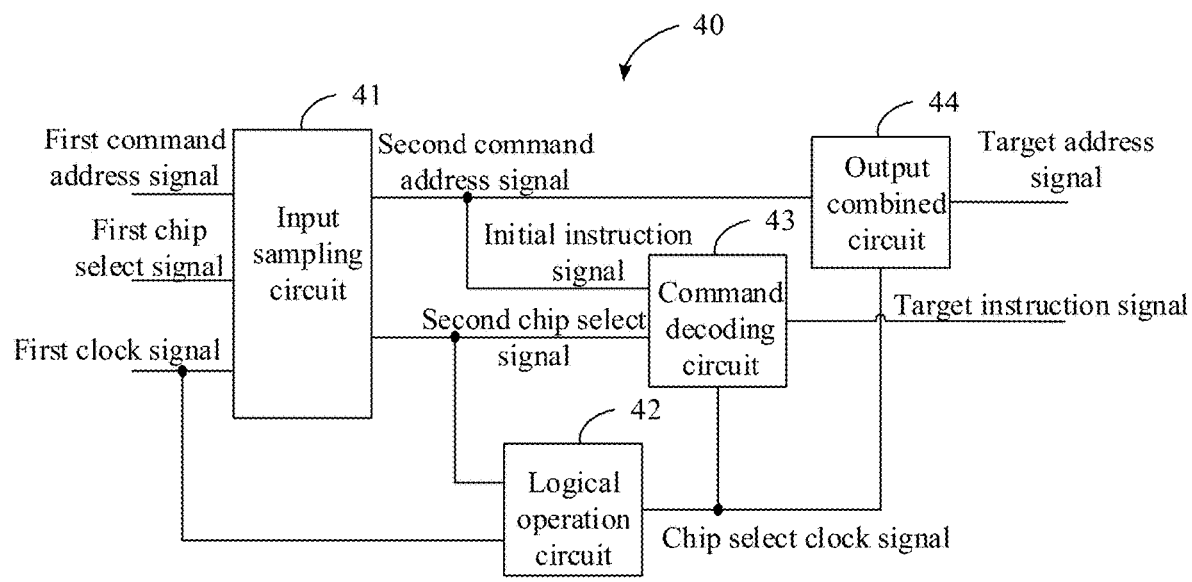
FIG. 4 illustrates a schematic diagram of a composition structure of a signal sampling circuit according to embodiments of the present disclosure.

In an embodiment of the present disclosure, referring to FIG. 4, FIG. 4 illustrates a schematic diagram of a composition structure of a signal sampling circuit according to embodiments of the present disclosure. As illustrated in FIG. 4, the signal sampling circuit 40 may include an input sampling circuit 41, a logical operation circuit 42, an instruction decoding circuit 43 and an output combination circuit 44.

The input sampling circuit 41 is configured to sample, according to a first clock signal, a first chip select signal and a first command address signal respectively to obtain a second chip select signal and a second command address signal. The second command address signal includes an initial command signal.

The logical operation circuit 42 is configured to perform logical operation on the first clock signal and the second chip select signal to obtain a chip select clock signal.

The instruction decoding circuit 43 is configured to decode and sample, according to the chip select clock signal and the second chip select signal, the initial instruction signal to obtain a target instruction signal.

The output combination circuit 44 is configured to sample and perform output combination on the second command address signal according to the chip select clock signal to obtain a target address signal.

It should be noted that, in the embodiments of the present disclosure, there is a timing alignment between the target address signal obtained according to the instruction decoding circuit 43 and the target instruction signal obtained according to the output combination circuit 44. Here, the timing alignment means that the target command signal and the target address signal simultaneously change from a low-level state to a high-level state, or simultaneously change from a high-level state to a low-level state. The terms "timing alignment" and "simultaneously" in the embodiments of the present disclosure mean that the timing deviation is within a preset accuracy range.

Figure 5:
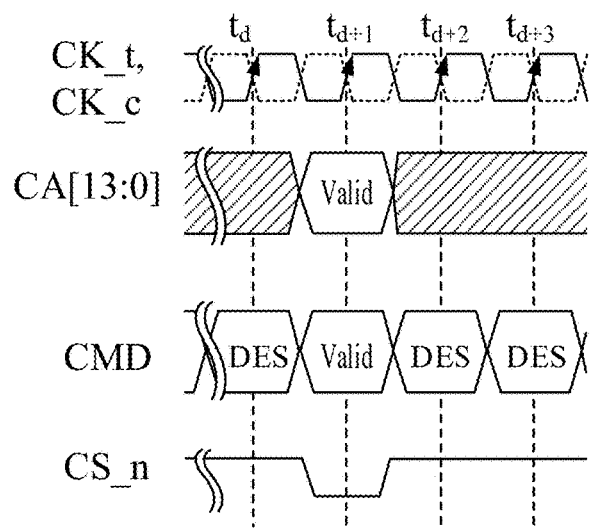
FIG. 5 illustrates a schematic diagram of signal timing of a clock cycle command.

It should also be noted that, in the embodiments of the present disclosure, the signal sampling circuit 40 described herein is applied to an instruction signal of a preset clock cycle (denoted by IT CMD). In other words, the target instruction signal here (denoted by CMD) includes only a valid command in the preset clock cycle as illustrated in FIG. 5. In FIG. 5, the CS_n signal is a pulse signal that is active at a low level and has a pulse width being the preset clock cycle. For the preset clock cycle, the CA[13:0] signal corresponding to the preset clock cycle is valid (Valid), and the CMD signal corresponding to the preset clock cycle is also valid (Valid). It should be noted that the preset clock cycle here refers to a clock cycle of the CK_t/CK_c signal.

It should also be noted that, in the embodiments of the present disclosure, in order to realize the timing alignment between the target address signal and the target instruction signal, the instruction decoding circuit 43 and the output combination circuit 44 are added, both of which perform sampling by using the same chip select clock signal. Therefore, the timing alignment between the target instruction signal sampled and output through the instruction decoding circuit 43 and the target address signal sampled and output through the output combination circuit 44 can be realized.

Figure 6:
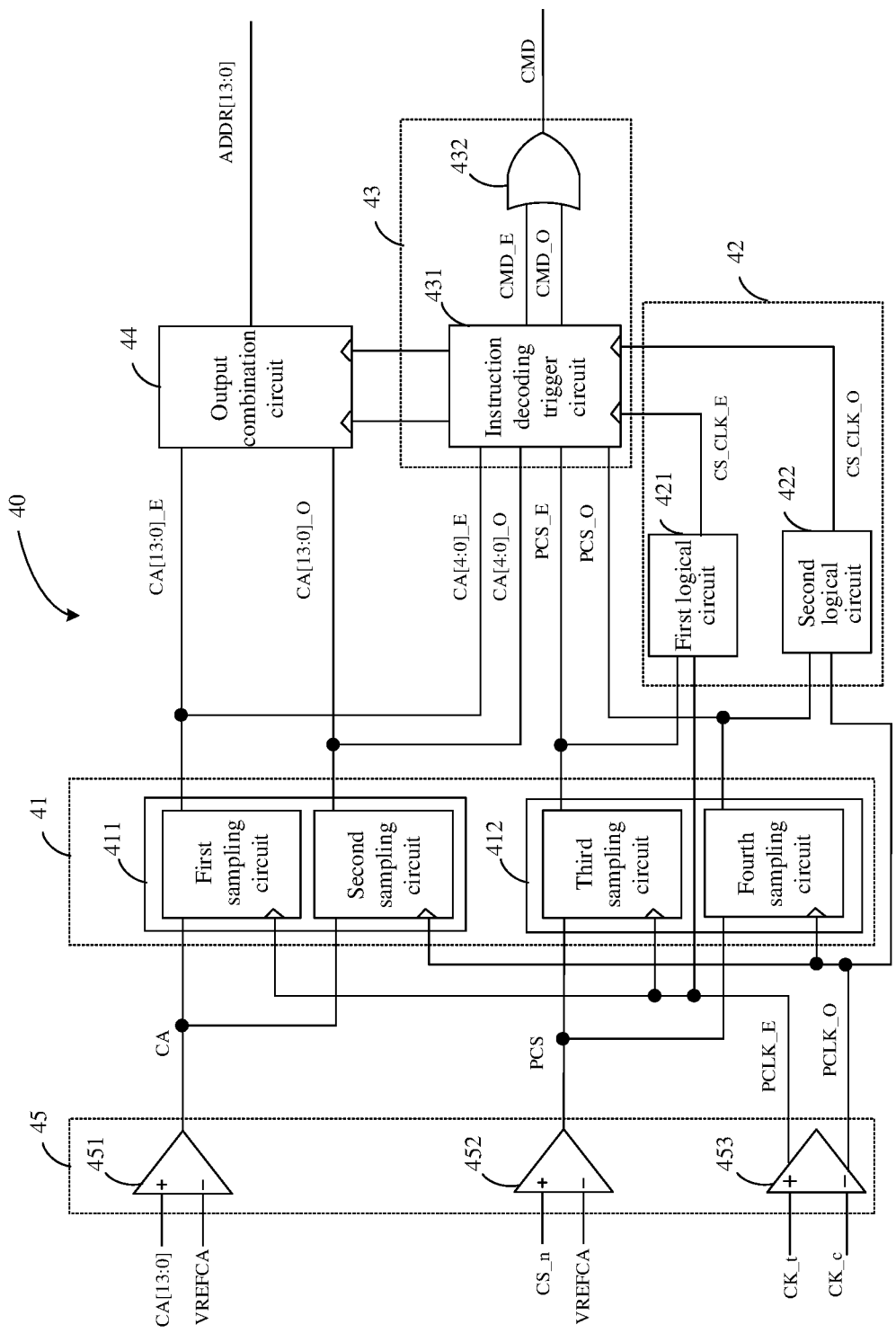
FIG. 6 illustrates a schematic diagram of a composition structure of another signal sampling circuit according to embodiments of the present disclosure.

In some embodiments, based on the signal sampling circuit 40 illustrated in FIG. 4, referring to FIG. 6, the signal sampling circuit 40 may further include a receiving circuit 45 that is connected with the input sampling circuit 41.

The receiving circuit 45 is configured to: receive an initial command address signal, an initial chip select signal and an initial clock signal, and output the first command address signal, the first chip select signal and the first clock signal.

It should be noted that through the receiving circuit 45, the first command address signal, the first chip select signal and the first clock signal may be obtained, and then input into the input sampling circuit 41 for sampling and subsequent logical operations. It should be noted that the first command address signal here is not one signal but a set of command address signals.

In some embodiments, for the receiving circuit 45 as shown in FIG. 6, the receiving circuit 45 may include a first receiving circuit 451, a second receiving circuit 452 and a third receiving circuit 453.

The first receiving circuit 451 is configured to receive the initial command address signal and output the first command address signal.

The second receiving circuit 452 is configured to receive the initial chip select signal and output the first chip select signal.

The third receiving circuit 453 is configured to receive the initial clock signal and perform frequency division on the initial clock signal, to obtain a first clock odd signal and a first clock even signal.

It should be noted that, in the embodiments of the present disclosure, each of the first receiving circuit 451, the second receiving circuit 452 and the third receiving circuit 453 may be a receiver (denoted by Receiver) or a buffer (denoted by Buffer).

It should be noted that, in the embodiments of the present disclosure, the initial command address signal here may be denoted by CA[13:0]. The first command address signal can be denoted by CA. The initial chip select signal can be denoted by CS_n. The first chip select signal can be denoted by PCS. The initial clock signal may be denoted by CK_t and CK_c, and the first clock signal may be composed of the first clock odd signal and the first clock even signal. The first clock even signal is denoted by PCLK_E, and the first clock odd signal is denoted by PCLK_O. Clock cycles of the first clock odd signal and the first clock even signal are both twice that of the initial clock signal, i.e., the clock cycles of the PCLK_E signal and the PCLK_O signal are both twice that of the preset clock cycle. A phase difference between the PCLK_E signal and the PCLK_O signal is 180 degrees.

It should also be noted that, in the embodiments of the present disclosure, no matter the initial command address signal or the first command address signal, it is not one signal, but represents a set of command address signals, i.e., CA[0]~CA[13]. Therefore, the first receiving circuit 451 may include 14 receiving circuits for receiving 14 signals, such as CA[0], CA[1], . . . , CA[13], and only one receiving circuit is shown for illustration.

Further, for the input sampling circuit 41, the embodiments of the present disclosure require not only the first command address signal to be sampled by using the first clock signal, but also the first chip select signal to be sampled by using the first clock signal. Thus, in some embodiments, as illustrated in FIG. 6, the input sampling circuit 41 may include a command address sampling circuit 411 and a chip select sampling circuit 412.

The command address sampling circuit 411 is configured to sample the first command address signal according to the first clock signal to obtain the second command address signal.

The chip select sampling circuit 412 is configured to sample and invert the first chip select signal according to the first clock signal to obtain the second chip select signal.

In a particular embodiment, as illustrated in FIG. 6, the command address sampling circuit 411 may include a first sampling circuit and a second sampling circuit.

The first sampling circuit is configured to sample the first command address signal according to the first clock even signal to obtain a second command address even signal.

The second sampling circuit is configured to sample the first command address signal according to the first clock odd signal to obtain a second command address odd signal.

It should be noted that the second command address signal may be composed of the second command address even signal and the second command address odd signal, and the initial instruction signal may be composed of an initial instruction even signal and an initial instruction odd signal. The second command address even signal includes the initial instruction even signal. The second command address even signal is denoted by CA[13:0]_E, and the initial instruction even signal is denoted by CA[4:0]_E. The second command address odd signal includes the initial instruction odd signal. The second command address odd signal is denoted by CA[13:0]_O, and the initial instruction odd signal is denoted by CA[4:0]_O. It should also be noted that the CA [13:0]_E is not one signal, but represents a set of command address signals (i.e., CA[0]_E~CA[13]_E), and the CA[4:0]_E represents CA[0]_E—CA[4]_E in this set of signals. The CA[13:0]_O is also not one signal, but represents a set of command address signals (i.e., CA[0]_O~CA[13]_O), and the CA[4:0]_O represents CA[0]_O~CA[4]_O in this set of signals.

It should also be explained that each of the first sampling circuit and the second sampling circuit can be composed of a D-type flip-flop. For the first sampling circuit, a clock end of the D-type flip-flop is connected with the PCLK_E signal, an input end of the D-type flip-flop is connected with the CA signal, and an output end of the D-type flip-flop is configured to output the CA[13:0]_E signal in which the CA[4:0]_E signal constitutes the initial instruction even signal. For the second sampling circuit, a clock end of the D-type flip-flop is connected with PCLK_O signal, an input end of the D-type flip-flop is connected with the CA signal, and an output end of the D-type flip-flop is configured to output CA[13:0]_O signal in which the CA[4:0]_O signal constitutes an initial instruction odd signal.

In another particular embodiment, as shown in FIG. 6, the chip select sampling circuit 412 may include a third sampling circuit and a fourth sampling circuit.

The third sampling circuit is configured to sample and invert the first chip select signal according to the first clock even signal, to obtain a second chip select even signal.

The fourth sampling circuit is configured to sample and invert the first chip select signal according to the first clock odd signal, to obtain a second chip select odd signal.

It should be noted that the second chip select signal is composed of the second chip select even signal and the second chip select odd signal. The second chip select even signal is denoted by PCS_E and the second chip select odd signal is denoted by PCS_O.

It should also be noted that each of the third sampling circuit and the fourth sampling circuit may be composed of a D-type flip-flop and an inverter. For the third sampling circuit, a clock end of the D-type flip-flop is connected with the PCLK_E signal, an input end of the D-type flip-flop is connected with the PCS signal, and an output end of the D-type flip-flop is connected with an input end of the inverter. An output end of the inverter is configured to output the PCS_E signal. For the fourth sampling circuit, a clock end of the D-type flip-flop is connected with the PCLK_O signal, an input end of the D-type flip-flop is connected with the PCS signal, and an output end of the D-type flip-flop is connected with an input end of the inverter. An output end of the inverter is configured to output the PCS_O signal. Here, since the PCS is a pulse signal that is active at a low level, after adding the inverter, the PCS_O signal or the PCS_E signal may become a pulse signal that is active at a high level, for subsequent logical operations. Additionally, for different subsequent logical operations, the inverter may not be needed here; in this case, the subsequent logical operations need to be adjusted accordingly, so as to reach the same effect.

In this way, through the receiving circuit 45 and the input sampling circuit 41, the first clock even signal (denoted by PCLK_E), the first clock odd signal (denoted by PCLK_O), the second chip select even signal (denoted by PCS_E), the second chip select odd signal (denoted by PCS_O), the second command address even signal (denoted by CA[13:0]_E), the second command address odd signal (denoted by CA[13:0]_O), the initial instruction even signal (denoted by CA[4:0]_E), and the initial instruction odd signal (denoted by CA[4:0]_O) can be obtained. Then, through the subsequent circuits, the same chip select clock signal is used to sample the second command address even signal (denoted by CA[13:0]_E) and the second command address odd signal (denoted by CA[13:0]_O), and to sample and decode the initial instruction even signal (denoted by CA[4:0]_E) and the initial instruction odd signal (denoted by CA[4:0]_O), so that the timing alignment between the target address signal and the target instruction signal that are finally output can be realized.

Further, for the logical operation circuit 42, the embodiments of the present disclosure need to obtain not only the chip select clock even signal, but also the chip select clock odd signal, so that the instruction decoding circuit 43 and the output combination circuit 44 can perform sampling in an odd-even manner subsequently, thereby reducing the quantity of address buses by half. Thus, in some embodiments, as illustrated in FIG. 6, the logical operation circuit 42 includes a first logical circuit 421 and a second logical circuit 422.

The first logical circuit 421 is configured to receive the first clock even signal and the second chip select even signal, and perform logical operation on the first clock even signal and the second chip select even signal to obtain a chip select clock even signal.

The second logical circuit 422 is configured to receive the first clock odd signal and the second chip select odd signal, and perform logical operation on the first clock odd signal and the second chip select odd signal to obtain a chip select clock odd signal.

It should be noted that the chip select clock signal may be composed of the chip select clock even signal and the chip select clock odd signal. The chip select clock even signal may be denoted by CS_CLK_E, and the chip select clock odd signal may be denoted by CS_CLK_O.

In a particular embodiment, for the first logical circuit 421, the first logical circuit 421 may include a first buffer and a first AND gate.

The first buffer is configured to delay the first clock even signal to obtain an intermediate clock even signal.

The first AND gate is configured to perform an AND operation on the second chip select even signal and the intermediate clock even signal to obtain the chip select clock even signal.

In another particular embodiment, the second logical circuit 422 may include a second buffer and a second AND gate.

The second buffer is configured to delay the first clock odd signal to obtain an intermediate clock odd signal.

The second AND gate is configured to perform an AND operation on the second chip select odd signal and the intermediate clock odd signal to obtain the chip select clock odd signal.

It should be noted that, for the buffers, each of the first buffer and the second buffer not only has a delay function, but also may have a function of enhancing the signal driving ability. Specifically, for the intermediate clock even signal and the first clock even signal, the intermediate clock even signal not only has a time delay compared with the first clock even signal, but also has a stronger driving ability. For the intermediate clock odd signal and the first clock odd signal, the intermediate clock odd signal not only has a time delay compared with the first clock odd signal, but also has a stronger driving ability.

It should also be noted that the chip select clock even signal (denoted by CS_CLK_E) is obtained through the first logical circuit 421, and the chip select clock odd signal (denoted by CS_CLK_O) is obtained through the first logical circuit 422. In the embodiments of the present disclosure, the instruction decoding circuit 43 and the output combination circuit 44 are correspondingly processed according to the two signals CS_CLK_E and CS_CLK_O. Thus, the timing alignment between the target address signal and the target instruction signal that are finally output can be realized.

It should also be noted that, in some embodiments, the first chip select signal indicates that a target chip is selected, and the first chip select signal is a pulse signal that is active at a low level.

In response to the first chip select signal being sampled to be at the low level at a rising edge of an even clock cycle, the second chip select even signal (denoted by PCS_E) is determined to be a pulse signal that is active at a high level, and the chip select clock even signal (denoted by CS_CLK_E) is determined to be a pulse signal that is active at the high level.

Alternatively, in response to the first chip select signal being sampled to be at the low level at a rising edge of an odd clock cycle, the second chip select odd signal (denoted by PCS_O) is determined to be a pulse signal that is active at the high level, and the chip select clock odd signal (denoted by CS_CLK_O) is determined to be a pulse signal that is active at the high level.

Here, the even clock cycle or the odd clock cycle refers to the clock cycle of the initial clock signal (denoted by CK_t/CK_c). Specifically, the PCLK_E signal and the PCLK_O signal may be obtained after the frequency division through the third receiving circuit 453. Then, the clock cycle where the rising edge of the PCLK_E signal is located is taken as the even clock cycle and the clock cycle where the rising edge of the PCLK_O signal is located is taken as the odd clock cycle.

Specifically, since only one of the PCS_E signal and the PCS_O signal is at the high level, it is also enabled, through the first logical circuit 421 and the second logical circuit 422, that only one of the CS_CLK_E signal and CS_CLK_O signal is an active signal being at the high level, and the other is an invalid signal (i.e., the signal being at the low level). That is, by shielding the chip select clock signal (denoted by CS_CLK_E or CS_CLK_O) during which the first chip select signal is at the high level (i.e., no command), unnecessary clock signal oscillation can be reduced, and thus, a function of saving power consumption can be realized.

Further, for the instruction decoding circuit 43, the odd signal and the even signal in the initial instruction signal need to be respectively sampled and decoded according to the chip select clock even signal and the chip select clock odd signal. Thus, in some embodiments, as illustrated in FIG. 6, the instruction decoding circuit 43 may include an instruction decoding trigger circuit 431 and an OR gate 432.

The instruction-decoding trigger circuit 431 is configured to receive the chip select clock signal, the second chip select signal and the initial instruction signal, and output the instruction even signal and the instruction odd signal.

The OR gate 432 is configured to perform an OR operation on the instruction even signal and the instruction odd signal to obtain the target instruction signal.

Figure 7:
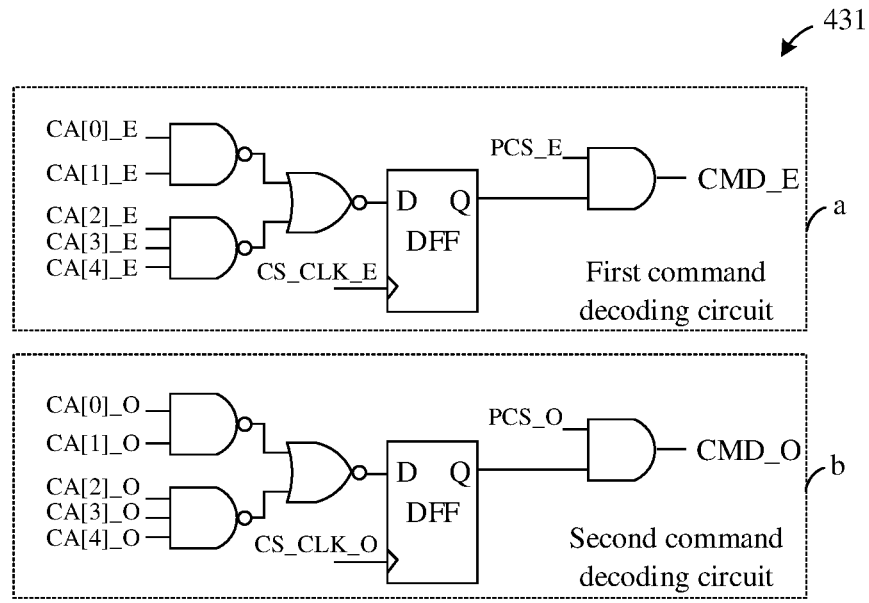
FIG. 7 illustrates a schematic diagram of a composition structure of an instruction decoding trigger circuit according to embodiments of the present disclosure.

It should be noted that the instruction decoding trigger circuit 431 herein may also be referred to as an instruction decoding trigger and is denoted by CMD DEC DFF. Referring to FIG. 7, the instruction decoding trigger circuit 431 may include a first instruction decoding circuit a and a second instruction decoding circuit b.

The first instruction decoding circuit a is configured to decode and sample, according to the chip select clock even signal and the second chip select even signal, the initial instruction even signal to obtain an instruction even signal.

The second instruction decoding circuit b is configured to decode and sample, according to the chip select clock odd signal and the second chip select odd signal, the initial instruction odd signal to obtain an instruction odd signal.

It should be noted that the target instruction signal can be denoted by CMD, and the target instruction signal is obtained by performing the OR logical operation on the instruction even signal (denoted by CMD_E) and the instruction odd signal (denoted by CMD_O). The CMD_E signal is obtained by the decoding and sampling operation through the first instruction decoding circuit a, and the CMD_O signal is obtained by the decoding and sampling operation through the second instruction decoding circuit b.

In a particular embodiment, as shown in FIG. 7, the first instruction decoding circuit a may include a first decoding circuit, a fifth sampling circuit and a third AND gate.

The first decoding circuit is configured to decode the initial instruction even signal to obtain an instruction decoded even signal.

The fifth sampling circuit is configured to sample the instruction decoded even signal according to the chip select clock even signal to obtain an instruction sampled even signal.

The third AND gate is configured to perform an AND operation on the second chip select even signal and the instruction sampled even signal to obtain the instruction even signal.

It should be noted that the initial instruction even signal may include instruction signals such as CA[0]_E, CA[1]_E, CA[2]_E, CA[3]_E, and CA[4]_E, and the first decoding circuit may be composed of a two-input NAND gate, a three-input NAND gate and a two-input NOR gate. As illustrated in FIG. 7, the signals CA[0]_E and CA[1]_E are input into the two-input NAND gate, and the signals CA[2]_E, CA[3]_E and CA[4]_E are input into the three-input NAND gate. Then, an output end of the two-input NAND gate and an output end of the three-input NAND gate are connected with input ends of the two-input NOR gate, and an output end of the two-input NOR gate is configured to output the instruction decoded even signal, thereby realizing the decoding of the initial instruction even signal. It should be noted that the design of the first decoding circuit is specifically implemented according to instruction decoding rules. For different products, different application scenarios and different instructions, the decoding rules may be different, and thus, the logics of the decoding circuit can be adjusted accordingly. No limitation is made in the embodiments of the present disclosure.

It should also be noted that the fifth sampling circuit may be a D-type flip-flop. As illustrated in FIG. 7, a clock end of the D-type flip-flop is connected with the chip select clock even signal (denoted by CS_CLK_E), and an input end of the D-type flip-flop is connected with the output end of the two-input NOR gate, so as to receive the instruction decoded even signal. An output end of the D-type flip-flop is connected with an input end of the third AND gate, the second chip select even signal (denoted by PCS_E) is connected with the other input end of the third AND gate, and the output end of the third AND gate is configured to output the instruction even signal. Thus, after sampling the instruction decoded even signal, the third AND gate can ensure that the instruction even signal is obtained only when the PCS_E signal is at the high level. That is, it is ensured that only one of the instruction even signal and the instruction odd signal is valid. In other words, other signals when PCS_E is not active at the high level can be shielded.

In another particular embodiment, as illustrated in FIG. 7, the second instruction decoding circuit b may include a second decoding circuit, a sixth sampling circuit, and a fourth AND gate.

The second decoding circuit is configured to decode the initial instruction odd signal to obtain an instruction decoded odd signal.

The sixth sampling circuit is configured to sample the instruction decoded odd signal according to the chip select clock odd signal to obtain an instruction sampled odd signal.

The fourth AND gate is configured to perform an AND operation on the second chip select odd signal and the instruction sampled odd signal to obtain the instruction odd signal.

It should be noted that the initial instruction odd signal may include instruction signals such as CA[0]_O, CA[1]_O, CA[2]_O, CA[3]_O, and CA[4]_O, and the second decoding circuit may also be composed of a two-input NAND gate, a three-input NAND gate and a two-input NOR gate. As illustrated in FIG. 7, the signals CA[0]_O and CA[1]_O are input into the two-input NAND gate, and the signals CA[2]_O, CA[3]_O and CA[4]_O are input into the three-input NAND gate. Then, an output end of the two-input NAND gate and an output end of the three-input NAND gate are connected with input ends of the two-input NOR gate, and an output end of the two-input NOR gate is configured to output the instruction decoded odd signal, thereby realizing the decoding of the initial instruction odd signal. It should be noted that the design of the second decoding circuit is also implemented according to the instruction decoding rules. For different products, different application scenarios and different instructions, the decoding rules may be different, and thus, the logics of the decoding circuit can be adjusted accordingly. No limitation is made in the embodiments of the present disclosure.

It should also be noted that the sixth sampling circuit may also be a D-type flip-flop. As illustrated in FIG. 7, a clock end of the D-type flip-flop is connected with the chip select clock odd signal (denoted by CS_CLK_O), and an input end of the D-type flip-flop is connected with the output end of the two-input NOR gate, so as to receive the instruction decoded odd signal. An output end of the D-type flip-flop is connected with an input end of the fourth AND gate, the second chip select odd signal (denoted by PCS_O) is connected with the other input end of the fourth AND gate, and an output end of the fourth AND gate is configured to output the instruction odd signal. Thus, after sampling the instruction decoded odd signal, the fourth AND gate can ensure that the instruction odd signal is obtained only when the PCS_O signal is at the high level. That is, it is ensured that only one of the instruction even signal and the instruction odd signal is valid. In other words, other signals when PCS_O is not active at the high level can be shielded.

It should also be noted that, in the embodiments of the present disclosure, only one of the chip select clock even signal (denoted by CS_CLK_E) and the chip select clock odd signal (denoted by CS_CLK_O) is a pulse signal that is active at the high level. In this way, in response to the chip select clock even signal (denoted by CS_CLK_E) being the pulse signal that is active at the high level, the sampling of the second instruction decoding circuit b is not executed because the chip select clock odd signal (denoted by CS_CLK_O) is a low-level signal. That is, when the instruction odd signal (denoted by CMD_O) is a low-level signal, the output obtained through the OR gate 432 performing the OR operation on the obtained instruction even signal (denoted by CMD_E) and the low-level signal is still the CMD_E signal. In other words, the CMD_E signal obtained at this time is the target instruction signal (denoted by CMD). In contrast, in response to the chip select clock odd signal (denoted by CS_CLK_O) being the pulse signal that is active at the high level, the sampling of the first instruction decoding circuit a is not executed because the chip select clock even signal (denoted by CS_CLK_E) is a low-level signal. That is, when the instruction even signal (denoted by CMD_E) is the low-level signal, the output obtained through the OR gate 432 by performing the OR operation on the obtained instruction odd signal (denoted by CMD_O) and the low-level signal is still a CMD_O signal. In other words, the CMD_O signal obtained at this time is the target instruction signal (denoted by CMD).

Figure 8:
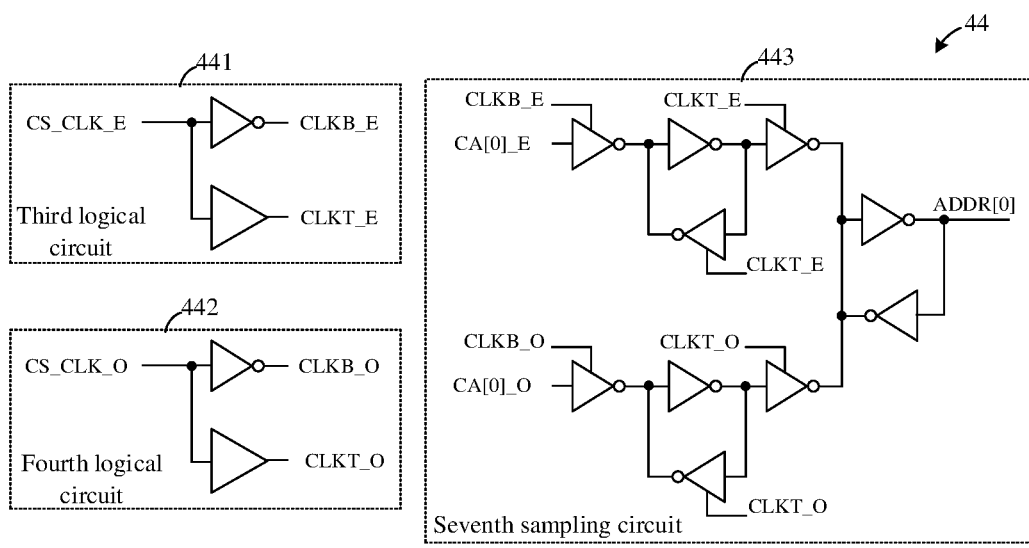
FIG. 8 illustrates a schematic diagram of a composition structure of an output combination circuit according to embodiments of the present disclosure.

Further, the output combination circuit 44 may also be referred as an output combination flip-flop, denoted by Output Combined DFF. That is, the output combination circuit 44 is essentially a D-type flip-flop, which mainly samples the second command address signal, to select address buses when the command is valid, and combines an odd address bus and an even address bus. Thus, in some embodiments, as illustrated in FIG. 8, the output combination circuit 44 may include a third logical circuit 441, a fourth logical circuit 442 and a seventh sampling circuit 443.

The third logical circuit 441 is configured to perform logical operation on the chip select clock even signal to obtain a first enabling even signal and a second enabling even signal.

The fourth logical circuit 442 is configured to perform logical operation on the chip select clock odd signal to obtain a first enabling odd signal and a second enabling odd signal.

The seventh sampling circuit 443 is configured to sample the second command address even signal and the second command address odd signal according to the following to obtain the target address signal: the first enabling even signal, the second enabling even signal, the first enabling odd signal and the second enabling odd signal.

It should be noted that, as illustrated in FIG. 8, the third logical circuit 441 may be composed of an inverter and a buffer. The first enabling even signal may be denoted by CLKB_E, the second enabling even signal may be denoted by CLKT_E, and a phase difference between the CLKB_E signal and the CLKT_E signal is 180 degrees.

It should also be noted that, as illustrated in FIG. 8, the fourth logical circuit 442 may also be composed of an inverter and a buffer. The first enabling odd signal may be denoted by CLKB_O, the second enabling odd signal may be denoted by CLKT_O, and a phase difference between the CLKB_O signal and the CLKT_O signal is 180 degrees.

It should also be noted that the second command address even signal is denoted by CA[13:0]_E, which represents 14 signals such as CA[0]_E, CA[1]_E, CA[2]_E, . . . , and CA[13]_E. The second command address odd signal is denoted by CA[13:0]_O, which represents 14 signals such as CA[0]_O, CA[1]_O, CA[2]_O, . . . , and CA[13]_O. That is, one seventh sampling circuit 443 is required for each set of signals (e.g., CA[0]_E and CA[0]_O, CA[1]_E and CA[1]_O, . . . , CA[13]_E and CA[13]_O). Namely, a total of 14 seventh sampling circuits 443 are required for the embodiments of the present disclosure. Taking the set of signals CA[0]_E and CA[0]_O as an example, as illustrated in FIG. 8, the seventh sampling circuit 443 may be composed of multiple enable inverters and multiple inverters. The CA[0]_E signal is sampled by using the first enabling even signal (denoted by CLKB_E) and the second enabling even signal (denoted by CLKT_E), the CA[0]_O signal is sampled by using the first enabling odd signal (denoted by CLKB_O) and the second enabling odd signal (denoted by CLKT_O). The finally output target address signal is denoted by ADDR[0].

Figure 9:
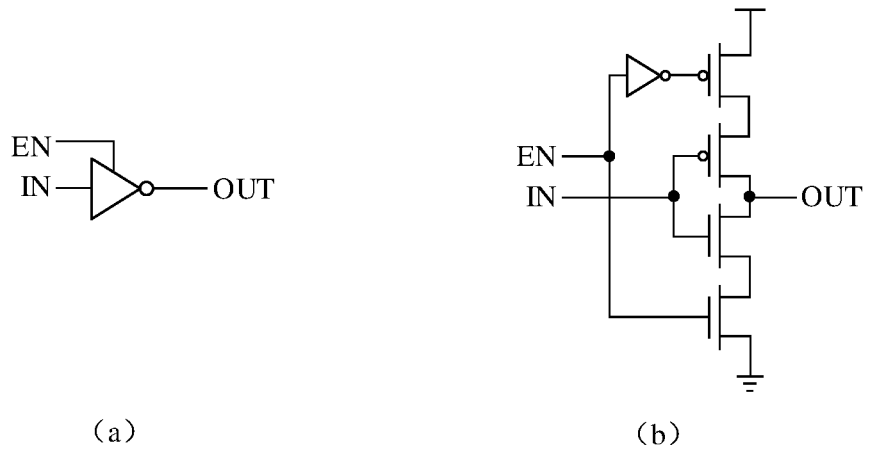
FIG. 9 illustrates a schematic diagram of a specific circuit structure of an enable inverter according to embodiments of the present disclosure.

In addition, referring to FIG. 9, FIG. 9 illustrates a schematic diagram of a specific circuit structure of an enable inverter. Here, part (a) of FIG. 9 is a device symbol of the enable inverter, and part (b) of FIG. 9 is the specific composition of the enable inverter. As illustrated in FIG. 9, the input signal is denoted by IN, the output signal is denoted by OUT, and the enabling signal is denoted by EN. Specifically, in the embodiments of the present disclosure, in response to the EN signal being at the high level, the inverter is enabled to operate. That is, the IN signal needs to be inverted to obtain an OUT signal. In response to the EN signal being at the low level, the inverter is turned off, and the output end of the inverter is in a high-impedance state.

In this way, the operation principle of the seventh sampling circuit 443 illustrated in FIG. 8 is specifically described as the following. When the CLKB_E signal is at the high level, the CA[0]_E signal is received. Through an enable inverter and a inverter following the enable inverter, the signal is transmitted to a node following the inverter. Then, when the CLKT_E signal is at the high level, the signal is output, thereby presenting an effect of sampling at the rising edge of the CLKT_E signal. In addition, when the CLKB_O signal is at the high level, the CA[0]_O signal is received. Through an enable inverter and an inverter following the enable inverter, the signal is transmitted to a node following the inverter. Then, when the CLKT_O signal is at the high level, the signal is output, thereby presenting an effect of sampling at the rising edge of the CLKT_O signal. Finally, two inverters, in which a head of one inverter is connected to a tail of the other inverter, at the ADDR[0] signal play the role of holding the signal.

In embodiments of the present disclosure, since only one of the chip select clock even signal (denoted by CS_CLK_E) and the chip select clock odd signal (denoted by CS_CLK_O) is a pulse signal that is active at the high level. Therefore, only one of the section that performs sampling by utilizing the CLKT_E signal and the section that performs sampling by utilizing the CLKT_O signal in the seventh sampling circuit 443 operates, and the other section outputs a high impedance state, so that the final ADDR can output a result of the operating section.

Further, only one of the chip select clock even signal (denoted by CS_CLK_E) and the chip select clock odd signal (denoted by CS_CLK_O) is a pulse signal that is active at the high level. Therefore, in some embodiments, in response to the chip select clock even signal being the pulse signal that is active at the high level, the seventh sampling circuit 443 is specifically configured to sample the second command address even signal according to the first enabling even signal and the second enabling even signal to obtain the target address signal. Alternatively, in response to the chip select clock odd signal being the pulse signal that is active at the high level, the seventh sampling circuit 443 is specifically configured to sample the second command address odd signal according to the first enabling odd signal and the second enabling odd signal to obtain the target address signal.

To sum up, in the embodiments of the present disclosure, the output signals CMD and ADDR[13:0] may be aligned by adding the instruction decoding circuit 43 and the output combination circuit 44 and using the same chip select clock signal (denoted by CS_CLK_E, CS_CLK_O) for the sampling operation. At the same time, since only the address buses that are valid for the same command are selected, the quantity of address buses is halved. That is, the address buses of even-odd sampling are combined by the output combination circuit 44, so that the quantity of the address buses can be halved.

The embodiments of the disclosure provide a signal sampling circuit, which includes an input sampling circuit, a logical operation circuit, an instruction decoding circuit and an output combination circuit. The input sampling circuit is configured to sample, according to a first clock signal, a first chip select signal and a first command address signal respectively to obtain a second chip select signal and a second command address signal. The second command address signal includes an initial command signal. The logical operation circuit is configured to perform logical operation on the first clock signal and the second chip select signal to obtain a chip select clock signal. The instruction decoding circuit is configured to decode and sample, according to the chip select clock signal and the second chip select signal, the initial instruction signal to obtain a target instruction signal. The output combination circuit is configured to sample and perform output combination on the second command address signal according to the chip select clock signal to obtain a target address signal. There is timing alignment between the target address signal and the target instruction signal. In this way, based on the signal sampling circuit, the timing alignment between the target instruction signal and the target address signal can be realized under the sampling in the same clock cycle, so that there is no deviation that changes as a function of the PVT between the decoded instruction signal and the address signal. Thus, the problem of the next-stage functional module caused by the timing deviation can be avoided.

Figure 10:
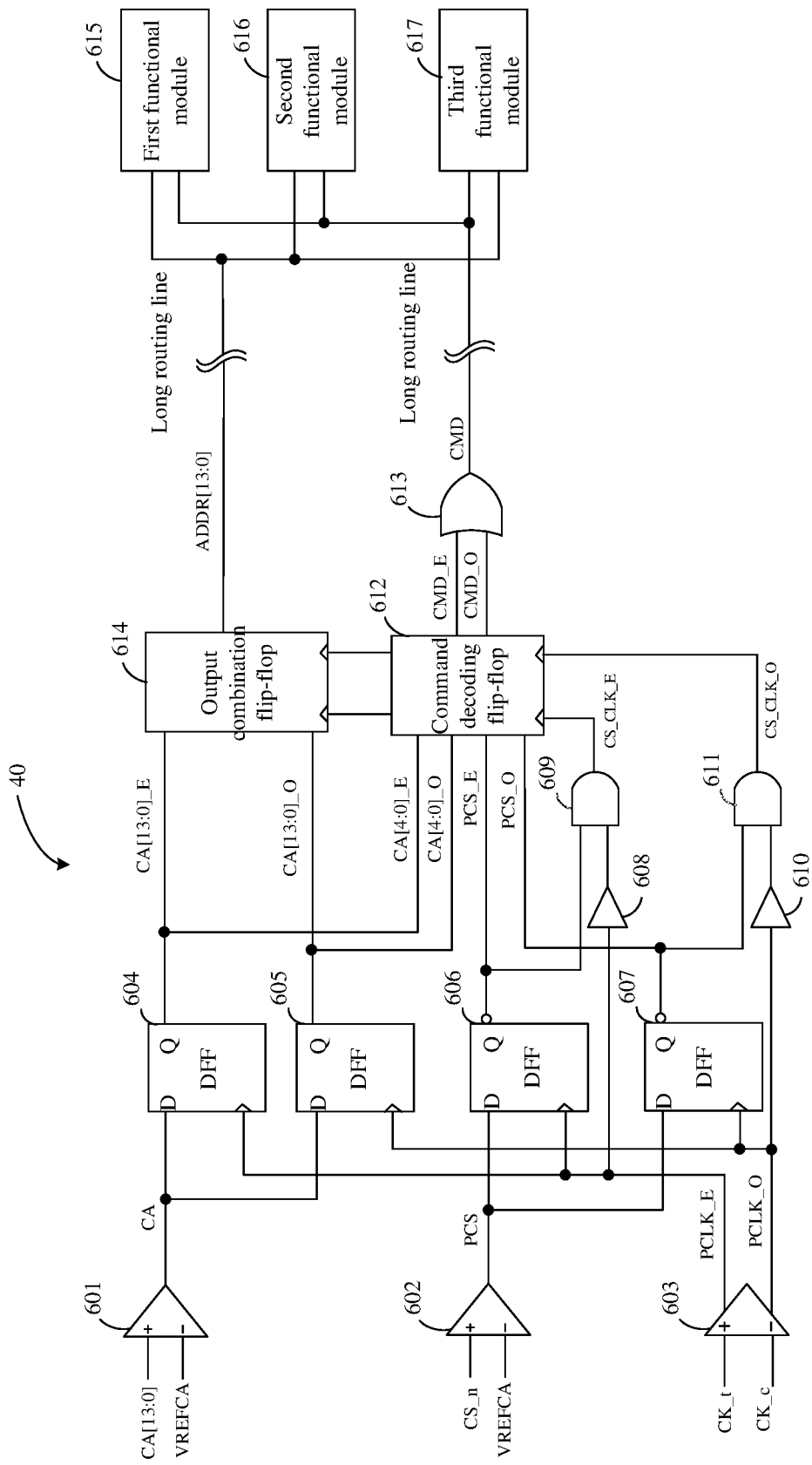
FIG. 10 illustrates a detailed structural diagram of a signal sampling circuit according to embodiments of the present disclosure.

In another embodiment of the present disclosure, based on the signal sampling circuit 40 described in the foregoing embodiments, referring to FIG. 10, FIG. 10 illustrates a detailed structural diagram of a signal sampling circuit according to embodiments of the present disclosure. As illustrated in FIG. 10, the signal sampling circuit 40 may include a first receiver 601, a second receiver 602, a third receiver 603, a first sampling circuit 604, a second sampling circuit 605, a third sampling circuit 606, a fourth sampling circuit 607, a first buffer 608, a first AND gate 609, a second buffer 610, a second AND gate 611, an instruction decoding flip-flop 612, an OR gate 613, an output combination flip-flop 614, a first functional module 615, a second functional module 616 and a third functional module 617. Each of the first sampling circuit 604 and the second sampling circuit 605 may be composed of a D-type flip-flop, and each of the third sampling circuit 606 and the fourth sampling circuit 607 may be composed of a D-type flip-flop and an inverter. Additionally, an internal structure of the instruction decoding flip-flop 612 is as illustrated in detail in FIG. 7, and an internal structure of the output combination flip-flop 614 is as illustrated in detail in FIG. 8.

In FIG. 10, input signals of the first receiver 601 are an initial command address signal (denoted by CA[13:0]) and a reference signal (denoted by VREFCA), and an output signal of the first receiver 60 is a first command address signal (denoted by CA). It should be noted that the initial command address signal CA[13:0] is not one signal, but represents a set of signals, i.e., CA[13]~CA[0]. One first receiver 601 is required for each signal, so 14 first receivers 601 are required for the embodiments of the present disclosure, and only one first receiver 601 is shown for illustration. Input signals of the second receiver 602 are an initial chip select signal (denoted by CS_n) and a reference signal (denoted by VREFCA), and an output signal of the second receiver 602 is a first chip select signal (denoted by PCS). Input signals of the third receiver 603 are a pair of input clock signals that are complementary to each other (denoted by CK_t and CK_c), and output signals of the third receiver 603 are a first clock even signal (denoted by PCLK_E) and a first clock odd signal (denoted by PCLK_O). Then, through the first sampling circuit 604, the first command address signal is sampled by using the first clock even signal to obtain a second command address even signal (denoted by CA[13:0]_E), and the second command address even signal includes an initial instruction even signal (denoted by CA[4:0]_E). Through the second sampling circuit 605, the first command address signal is sampled by using the first clock odd signal to obtain a second command address odd signal (denoted by CA[13:0]_O), and the second command address odd signal includes an initial instruction odd signal (denoted by CA[4:0]_O). Through the third sampling circuit 606, the first chip select signal is sampled and inverted by using the first clock even signal to obtain a second chip select even signal (denoted by PCS_E). Through the fourth sampling circuit 607, the first chip select signal is sampled and inverted by using the first clock odd signal to obtain the second chip select odd signal (denoted by PCS_O). Logical operations are performed on the PCLK_E signal and the PCS_E signal by using the first buffer 608 and the first AND gate 609 to obtain a chip select clock even signal (denoted by CS_CLK_E). Logical operations are performed on the PCLK_O signal and the PCS_O signal by using the second buffer 610 and the second AND gate 611 to obtain a chip select clock odd signal (denoted by CS_CLK_O). Next, the CA[4:0]_E signal, the CA[4:0]_O signal, the PCS_E signal and the PCS_O signal are decoded and sampled through the instruction decoding flip-flop 612 by using the CS_CLK_E signal and the CS_CLK_O signal to obtain an instruction even signal (denoted by CMD_E) and an instruction odd signal (denoted by CMD_O). Then, an OR logical operation is performed on the CMD_E signal and the CMD_O signal through the OR gate 613 to obtain a target instruction signal (denoted by CMD). Through the output combination flip-flop 614, the CA[13:0]_E signal and the CA[13:0]_O signal are sampled by using the CS_CLK_E signal and the CS_CLK_O signal to obtain a target address signal (denoted by ADDR[13:0]). In addition, there is a long routing line from the CMD signal and the ADDR[13:0] signal to the first functional module 615, the second functional module 616, and the third functional module 617. However, it is required to control the long routing lines of the CMD signal and the long routing lines of the ADDR[13:0] signal to be consistent in the length and in the width as far as possible. Since there is timing alignment between output of the CMD signal and the ADDR[13:0] signal, the CMD signal and the ADDR[13: 0] signal can reach different functional modules (e.g., the first functional module 615, the second functional module 616 and the third functional module 617) to realize the next-stage function without an error caused by timing deviation.

Figure 11:
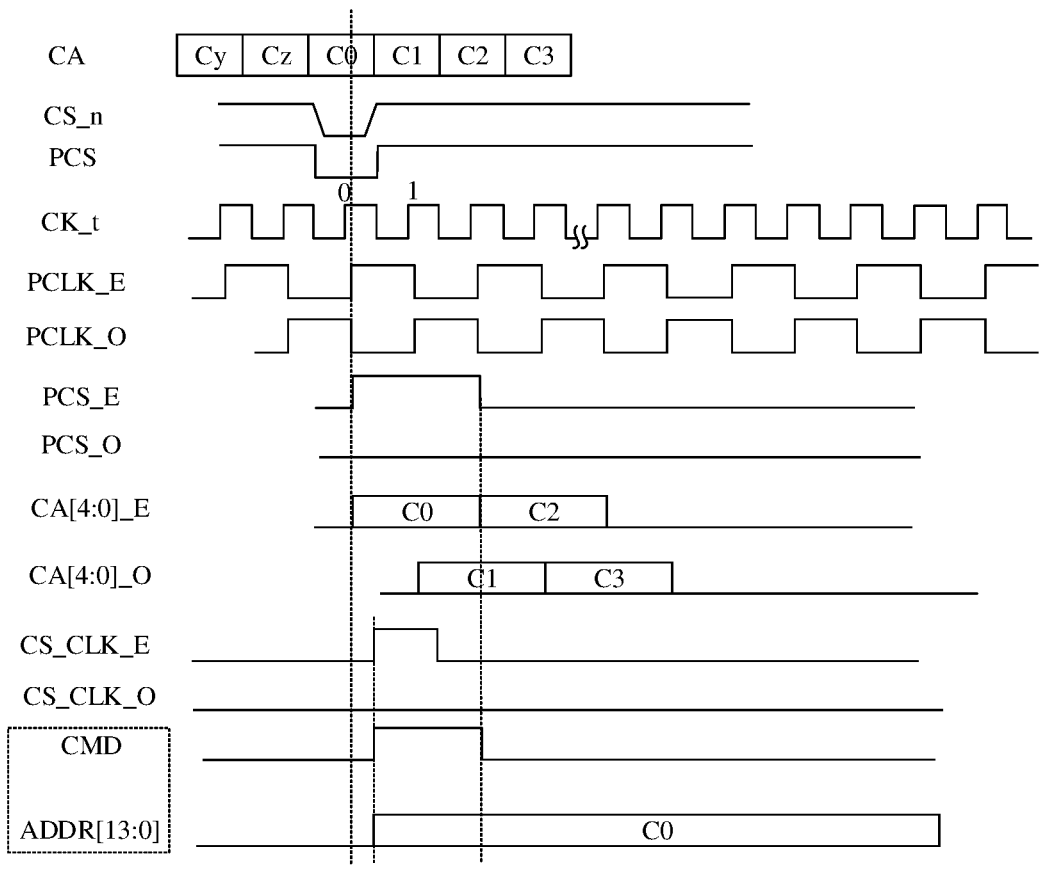
FIG. 11 illustrates a schematic diagram of signal timing of a signal sampling circuit according to embodiments of the present disclosure.

Based on the signal sampling circuit illustrated in FIG. 10, a corresponding signal timing diagram is as illustrated in FIG. 11. In FIG. 11, the first command address signal is denoted by CA, and the CA signal may include Cy, Cz, C0, C1, C2 and C3. The initial chip select signal is denoted by CS_n. The first chip select signal is denoted by PCS. The PCS signal is a pulse signal that is active at a low level and has a pulse width being a preset clock cycle. The PCS signal indicates that a target chip is selected. The initial clock signal is denoted by CK_t. The first clock even signal is denoted by PCLK_E. The first clock odd signal is denoted by PCLK_O. A clock cycle of the CK_t signal is a preset clock cycle, and clock cycles of the PCLK_E signal and the PCLK_O signal are both twice of the preset clock cycle. In addition, the clock cycle where the rising edge of the PCLK_E signal is located is taken as the even clock cycle. FIG. 11 illustrates a signal timing diagram corresponding to a first chip select signal being sampled to be a low level at the rising edge of an even clock cycle. That is, the second chip select even signal obtained after the PCS signal is sampled and inverted by using the rising edge of PCLK_E signal is denoted by PCS_E, which is a pulse signal that is active at the high level and has a pulse width being twice of the preset clock cycle. The second chip select odd signal obtained after the PCS signal is sampled and inverted by using the rising edge of PCLK_O signal is denoted by PCS_O, which is a low-level signal. After the CA signal is sampled by using the rising edge of the PCLK_E signal, the initial instruction even signal (denoted by CA[4:0]_E) is obtained, which includes C0 and C2. After the CA signal is sampled by the rising edge of the PCLK_O signal, the initial instruction odd signal (denoted by CA[4:0]_O) is obtained, which includes C1 and C3. In addition, a chip select clock even signal obtained by performing logical operations on the PCLK_E signal and the PCS_E signal by using the first buffer 608 and the first AND gate 609 is denoted by CS_CLK_E, which is a pulse signal that is active at the high level and has a pulse width being a preset clock cycle. A chip select clock odd signal obtained by performing logical operations on the PCLK_O signal and the PCS_O signal by using the second buffer 610 and the second AND gate 611 is denoted by CS_CLK_O, which is a low-level signal. Thus, it can be seen from FIG. 11 that only the CS_CLK_E signal is valid, and there is timing alignment between the target instruction signal CMD obtained by the decoding and sampling of the instruction decoding flip-flop 612 and the OR gate 613 and the target address signal ADDR[13:0] obtained by the sampling of the output combination flip-flop 614.

It should be note that, in FIG. 11, in the same clock cycle, the delay between the rising edge of the PCS_E signal and the rising edge of the CS_CLK_E signal is generated by the logical devices themselves, such as, the first buffer 608 and the first AND gate 609. In the embodiments of the present disclosure, in order to avoid the output deviation between the CMD signal and the ADDR[13:0] signal, the same chip select clock signal (denoted by CS_CLK_E or CS_CLK_O) can be used for decoding and sampling. Thus, there is timing alignment between output of the CMD signal and the ADDR[13:0] signal, and then, the CMD signal and the ADDR[13:0] signal can reach different functional modules to realize a next-stage function without an error caused by timing deviation.

The embodiments of the present disclosure provide a signal sampling circuit. Through the embodiment, the specific implementation of the foregoing embodiments is described in detail. Thus, it can be seen that in the embodiments of the present disclosure, optimization is made based on the basis of the existing direct sampling and decoding, so that there is no deviation between the decoded instruction (decoded by CMD) and the sampled address buses (decoded by ADDR[13:0]) changing with PVT. Specifically, in the embodiments of the present disclosure, the instruction decoding flip-flop and the output combination flip-flop are added, the chip select clock signal is used to shield the clock in response to the first chip select signal being at the high level (i.e. no command), and then the chip select clock signal is used to perform the sampling; in this way, the CMD and ADDR[13:0] can be aligned. Moreover, through the output combination flip-flop according to the embodiments of the present disclosure, the address buses of the even-odd sampling are combined, so that the quantity of the address buses can be halved.

Figure 12:
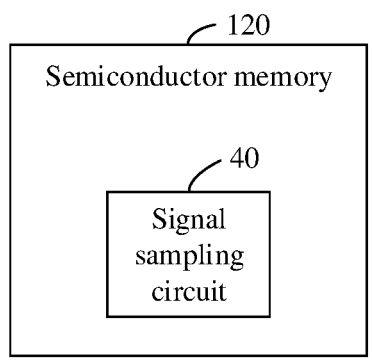
FIG. 12 illustrates a schematic diagram of a composition structure of a semiconductor memory according to embodiments of the present disclosure.

In yet another embodiment of the present disclosure, referring to FIG. 12, FIG. 12 illustrates a schematic diagram of a composition structure of a semiconductor memory 120 according to embodiments of the present disclosure. As illustrated in FIG. 12, the semiconductor memory 120 may include the signal sampling circuit 40 as described in any of the foregoing embodiments.

In embodiments of the present disclosure, the semiconductor memory 120 may be a dynamic random access memory (DRAM) chip.

Further, in some embodiments, the DRAM chip conforms to the DDR5 memory specification.

It should be noted that the embodiments of the present disclosure mainly relate to the circuits related to the input signal sampling and instruction decoding in integrated circuit design, in particular to a control and adjustment circuit in DRAM chip where a CA signal input is sampled and decoded as instruction and address respectively. Specifically, in the embodiments of the present disclosure, optimization is made the basis of the existing direct sampling and decoding, so that there is no deviation between the decoded CMD signal and the sampled ADDR[13:0] signal that changes with PVT.

It should also be noted that the embodiments of the present disclosure can be applied to a control circuit for sampling and decoding a CA signal in a DRAM chip, but is not limited thereto. Other circuits related to the input signal sampling and instruction decoding can adopt this design.

As such, in the embodiments of that present disclosure, the semiconductor memory 120 includes the signal sampling circuit 40, so that the timing alignment between the target instruction signal and the target address signal can be realized under sampling in the same clock cycle. Therefore, there is no deviation between the decoded instruction signal and the address signal that changes with the PVT; as such, the problem of the next-stage functional module caused by timing deviation can be avoided.

The above are only preferred embodiments of the present disclosure and are not intended to limit the scope of protection of the present disclosure.

It should be noted that, in the present disclosure, the terms "comprising", "including" or any other variant thereof are intended to encompass non-exclusive inclusion. Thus, a process, method, article or device including a set of elements includes not only those elements, but also other elements that are not explicitly listed, or also elements inherent to such process, method, article or device. In the absence of further limitations, an element defined by the phrase "includes a . . . " does not preclude the existence of additional identical elements in the process, method, article or device in which it is included.

The aforementioned serial numbers of the embodiments of the present disclosure are for description only, and do not represent the advantages and disadvantages of the embodiments.

The methods disclosed in the several method embodiments provided in the present disclosure can be arbitrarily combined without conflict, to obtain new method embodiments.

Features disclosed in several product embodiments provided in the present disclosure can be arbitrarily combined without conflict, to obtain new product embodiments.

Features disclosed in several method or device embodiments provided in the present disclosure can be arbitrarily combined without conflict, to obtain new method or device embodiments.

The aforementioned are merely detailed description of the present disclosure, but the scope of protection of the present disclosure is not limited thereto. Changes or substitutions that would readily occur to those skilled in the art within the technical scope of the present disclosure should be covered within the scope of protection of the present disclosure. Therefore, the scope of protection of the present disclosure shall be subject to the scope of protection of the claims.

What is claimed is:

1. A signal sampling circuit, comprising an input sampling circuit, a logical operation circuit, an instruction decoding circuit, and an output combination circuit; wherein
the input sampling circuit is configured to sample, according to a first clock signal, a first chip select signal and a first command address signal respectively to obtain a second chip select signal and a second command address signal, and the second command address signal comprises an initial instruction signal;
the logical operation circuit is configured to perform logical operation on the first clock signal and the second chip select signal to obtain a chip select clock signal;
the instruction decoding circuit is configured to decode and sample, according to the chip select clock signal and the second chip select signal, the initial instruction signal to obtain a target instruction signal; and
the output combination circuit is configured to sample and perform output combination on the second command address signal according to the chip select clock signal to obtain a target address signal;
the signal sampling circuit further comprising a receiving circuit that is connected with the input sampling circuit, wherein the receiving circuit is configured to: receive an initial command address signal, an initial chip select signal and an initial clock signal, and output the first command address signal, the first chip select signal and the first clock signal;
wherein the receiving circuit comprises a first receiving circuit, a second receiving circuit, and a third receiving circuit;
the first receiving circuit is configured to receive the initial command address signal and output the first command address signal;
the second receiving circuit is configured to receive the initial chip select signal and output the first chip select signal; and
the third receiving circuit is configured to receive the initial clock signal and perform frequency division on the initial clock signal to obtain a first clock odd signal and a first clock even signal, clock cycles of the first clock odd signal and the first clock even signal are both twice a clock cycle of the initial clock signal, the first clock signal is composed of the first clock odd signal and the first clock even signal, and a phase difference between the first clock odd signal and the first clock even signal is 180 degrees;
wherein the input sampling circuit comprises a command address sampling circuit and a chip select sampling circuit;
the command address sampling circuit is configured to sample the first command address signal according to the first clock signal to obtain the second command address signal; and
the chip select sampling circuit is configured to sample and invert the first chip select signal according to the first clock signal to obtain the second chip select signal;
wherein the command address sampling circuit comprises a first sampling circuit and a second sampling circuit;
the first sampling circuit is configured to sample the first command address signal according to the first clock even signal to obtain a second command address even signal;
the second sampling circuit is configured to sample the first command address signal according to the first clock odd signal to obtain a second command address odd signal; and
the second command address signal is composed of the second command address even signal and the second command address odd signal, the initial instruction signal is composed of an initial instruction even signal and an initial instruction odd signal, the second command address even signal comprises the initial instruction even signal, and the second command address odd signal comprises the initial instruction odd signal;
wherein the chip select sampling circuit comprises a third sampling circuit and a fourth sampling circuit;
the third sampling circuit is configured to sample and invert the first chip select signal according to the first clock even signal to obtain a second chip select even signal;
the fourth sampling circuit is configured to sample and invert the first chip select signal according to the first clock odd signal to obtain a second chip select odd signal; and
the second chip select signal is composed of the second chip select even signal and the second chip select odd signal;
wherein the logical operation circuit comprises a first logical circuit and a second logical circuit;
the first logical circuit is configured to receive the first clock even signal and the second chip select even signal, and perform logical operation on the first clock even signal and the second chip select even signal to obtain a chip select clock even signal;
the second logical circuit is configured to receive the first clock odd signal and the second chip select odd signal, and perform logical operation on the first clock odd signal and the second chip select odd signal to obtain a chip select clock odd signal; and
the chip select clock signal is composed of the chip select clock even signal and the chip select clock odd signal;
wherein the first logical circuit comprises a first buffer and a first AND gate; the first buffer is configured to delay the first clock even signal to obtain an intermediate clock even signal; and the first AND gate is configured to perform an AND operation on the second chip select even signal and the intermediate clock even signal to obtain the chip select clock even signal; and/or the second logical circuit comprises a second buffer and a second AND gate; the second buffer is configured to delay the first clock odd signal to obtain an intermediate clock odd signal; and the second AND gate is configured to perform an AND operation on the second chip select odd signal and the intermediate clock odd signal to obtain the chip select clock odd signal.

2. A semiconductor memory comprising the signal sampling circuit according to claim 1.

3. The semiconductor memory of claim 2, wherein the semiconductor memory is a dynamic random access memory (DRAM) chip.

4. A signal sampling circuit, comprising an input sampling circuit, a logical operation circuit, an instruction decoding circuit, and an output combination circuit, a receiving circuit; wherein the input sampling circuit is configured to sample, according to a first clock signal, a first chip select signal and a first command address signal respectively to obtain a second chip select signal and a second command address signal, and the second command address signal comprises an initial instruction signal;

the logical operation circuit is configured to perform logical operation on the first clock signal and the second chip select signal to obtain a chip select clock signal;

the instruction decoding circuit is configured to decode and sample, according to the chip select clock signal and the second chip select signal, the initial instruction signal to obtain a target instruction signal; and the output combination circuit is configured to sample and perform output combination on the second command address signal according to the chip select clock signal to obtain a target address signal;

the signal sampling circuit further comprising a receiving circuit that is connected with the input sampling circuit, wherein the receiving circuit is configured to: receive an initial command address signal, an initial chip select signal and an initial clock signal, and output the first command address signal, the first chip select signal and the first clock signal;

wherein the receiving circuit comprises a first receiving circuit, a second receiving circuit, and a third receiving circuit;

the first receiving circuit is configured to receive the initial command address signal and output the first command address signal;

the second receiving circuit is configured to receive the initial chip select signal and output the first chip select signal; and the third receiving circuit is configured to receive the initial clock signal and perform frequency division on the initial clock signal to obtain a first clock odd signal and a first clock even signal, clock cycles of the first clock odd signal and the first clock even signal are both twice a clock cycle of the initial clock signal, the first clock signal is composed of the first clock odd signal and the first clock even signal, and a phase difference between the first clock odd signal and the first clock even signal is 180 degrees;

wherein the input sampling circuit comprises a command address sampling circuit and a chip select sampling circuit;

the command address sampling circuit is configured to sample the first command address signal according to the first clock signal to obtain the second command address signal; and the chip select sampling circuit is configured to sample and invert the first chip select signal according to the first clock signal to obtain the second chip select signal;

wherein the command address sampling circuit comprises a first sampling circuit and a second sampling circuit;

the first sampling circuit is configured to sample the first command address signal according to the first clock even signal to obtain a second command address even signal;

the second sampling circuit is configured to sample the first command address signal according to the first clock odd signal to obtain a second command address odd signal; and the second command address signal is composed of the second command address even signal and the second command address odd signal, the initial instruction signal is composed of an initial instruction even signal and an initial instruction odd signal, the second command address even signal comprises the initial instruction even signal, and the second command address odd signal comprises the initial instruction odd signal;

wherein the chip select sampling circuit comprises a third sampling circuit and a fourth sampling circuit;

the third sampling circuit is configured to sample and invert the first chip select signal according to the first clock even signal to obtain a second chip select even signal;

the fourth sampling circuit is configured to sample and invert the first chip select signal according to the first clock odd signal to obtain a second chip select odd signal; and the second chip select signal is composed of the second chip select even signal and the second chip select odd signal;

wherein the logical operation circuit comprises a first logical circuit and a second logical circuit;

the first logical circuit is configured to receive the first clock even signal and the second chip select even signal, and perform logical operation on the first clock even signal and the second chip select even signal to obtain a chip select clock even signal;

the second logical circuit is configured to receive the first clock odd signal and the second chip select odd signal, and perform logical operation on the first clock odd signal and the second chip select odd signal to obtain a chip select clock odd signal; and the chip select clock signal is composed of the chip select clock even signal and the chip select clock odd signal;

wherein the instruction decoding circuit comprises a first instruction decoding circuit, a second instruction decoding circuit, and an OR gate;

the first instruction decoding circuit is configured to decode and sample, according to the chip select clock even signal and the second chip select even signal, the initial instruction even signal to obtain an instruction even signal;

the second instruction decoding circuit is configured to decode and sample, according to the chip select clock odd signal and the second chip select odd signal, the initial instruction odd signal to obtain an instruction odd signal; and the OR gate is configured to perform an OR operation on the instruction even signal and the instruction odd signal to obtain the target instruction signal.

5. The signal sampling circuit of claim 4, wherein the first instruction decoding circuit comprises a first decoding circuit, a fifth sampling circuit, and a third AND gate;
the first decoding circuit is configured to decode the initial instruction even signal to obtain an instruction decoded even signal;
the fifth sampling circuit is configured to sample the instruction decoded even signal according to the chip select clock even signal to obtain an instruction sampled even signal; and
the third AND gate is configured to perform an AND operation on the second chip select even signal and the instruction sampled even signal to obtain the instruction even signal.

6. The signal sampling circuit of claim 4, wherein the second instruction decoding circuit comprises a second decoding circuit, a sixth sampling circuit, and a fourth AND gate;
the second decoding circuit is configured to decode the initial instruction odd signal to obtain an instruction decoded odd signal;
the sixth sampling circuit is configured to sample the instruction decoded odd signal according to the chip select clock odd signal to obtain an instruction sampled odd signal; and
the fourth AND gate is configured to perform an AND operation on the second chip select odd signal and the instruction sampled odd signal to obtain the instruction odd signal.

7. A semiconductor memory comprising the signal sampling circuit according to claim 4.

8. A signal sampling circuit, comprising an input sampling circuit, a logical operation circuit, an instruction decoding circuit, and an output combination circuit, a receiving circuit; wherein
the input sampling circuit is configured to sample, according to a first clock signal, a first chip select signal and a first command address signal respectively to obtain a second chip select signal and a second command address signal, and the second command address signal comprises an initial instruction signal;
the logical operation circuit is configured to perform logical operation on the first clock signal and the second chip select signal to obtain a chip select clock signal;
the instruction decoding circuit is configured to decode and sample, according to the chip select clock signal and the second chip select signal, the initial instruction signal to obtain a target instruction signal; and
the output combination circuit is configured to sample and perform output combination on the second command address signal according to the chip select clock signal to obtain a target address signal;
the signal sampling circuit further comprising a receiving circuit that is connected with the input sampling circuit, wherein the receiving circuit is configured to: receive an initial command address signal, an initial chip select signal and an initial clock signal, and output the first command address signal, the first chip select signal and the first clock signal;
wherein the receiving circuit comprises a first receiving circuit, a second receiving circuit, and a third receiving circuit;

the first receiving circuit is configured to receive the initial command address signal and output the first command address signal;
the second receiving circuit is configured to receive the initial chip select signal and output the first chip select signal; and
the third receiving circuit is configured to receive the initial clock signal and perform frequency division on the initial clock signal to obtain a first clock odd signal and a first clock even signal, clock cycles of the first clock odd signal and the first clock even signal are both twice a clock cycle of the initial clock signal, the first clock signal is composed of the first clock odd signal and the first clock even signal, and a phase difference between the first clock odd signal and the first clock even signal is 180 degrees;
wherein the input sampling circuit comprises a command address sampling circuit and a chip select sampling circuit;
the command address sampling circuit is configured to sample the first command address signal according to the first clock signal to obtain the second command address signal; and
the chip select sampling circuit is configured to sample and invert the first chip select signal according to the first clock signal to obtain the second chip select signal;
wherein the command address sampling circuit comprises a first sampling circuit and a second sampling circuit;
the first sampling circuit is configured to sample the first command address signal according to the first clock even signal to obtain a second command address even signal;
the second sampling circuit is configured to sample the first command address signal according to the first clock odd signal to obtain a second command address odd signal; and
the second command address signal is composed of the second command address even signal and the second command address odd signal, the initial instruction signal is composed of an initial instruction even signal and an initial instruction odd signal, the second command address even signal comprises the initial instruction even signal, and the second command address odd signal comprises the initial instruction odd signal;
wherein the chip select sampling circuit comprises a third sampling circuit and a fourth sampling circuit;
the third sampling circuit is configured to sample and invert the first chip select signal according to the first clock even signal to obtain a second chip select even signal;
the fourth sampling circuit is configured to sample and invert the first chip select signal according to the first clock odd signal to obtain a second chip select odd signal; and
the second chip select signal is composed of the second chip select even signal and the second chip select odd signal;
wherein the logical operation circuit comprises a first logical circuit and a second logical circuit;
the first logical circuit is configured to receive the first clock even signal and the second chip select even signal, and perform logical operation on the first clock even signal and the second chip select even signal to obtain a chip select clock even signal;
the second logical circuit is configured to receive the first clock odd signal and the second chip select odd signal, and perform logical operation on the first clock odd signal and the second chip select odd signal to obtain a chip select clock odd signal; and the chip select clock signal is composed of the chip select clock even signal and the chip select clock odd signal;

wherein the first chip select signal indicates that a target chip is selected, and the first chip select signal is a pulse signal that is active at a low level;

in response to the first chip select signal being sampled to be at the low level at a rising edge of an even clock cycle, the second chip select even signal is determined to be a pulse signal that is active at a high level, and the chip select clock even signal is determined to be a pulse signal that is active at the high level; or, in response to the first chip select signal being sampled to be at the low level at a rising edge of an odd clock cycle, the second chip select odd signal is determined to be a pulse signal that is active at the high level, and the chip select clock odd signal is determined to be a pulse signal that is active at the high level;

wherein the output combination circuit comprises a third logical circuit, a fourth logical circuit, and a seventh sampling circuit;

the third logical circuit is configured to perform logical operation on the chip select clock even signal to obtain a first enabling even signal and a second enabling even signal, and a phase difference between the first enabling even signal and the second enabling even signal is 180 degrees;

the fourth logical circuit is configured to perform logical operation on the chip select clock odd signal to obtain a first enabling odd signal and a second enabling odd signal, and a phase difference between the first enabling odd signal and the second enabling odd signal is 180 degrees; and the seventh sampling circuit is configured to sample the second command address even signal and the second command address odd signal to obtain the target address signal, according to: the first enabling even signal, the second enabling even signal, the first enabling odd signal and the second enabling odd signal.

9. The signal sampling circuit of claim 8, wherein the seventh sampling circuit is configured to:

in response to the chip select clock even signal being the pulse signal that is active at the high level, sample the second command address even signal according to the first enabling even signal and the second enabling even signal to obtain the target address signal; or, in response to the chip select clock odd signal being the pulse signal that is active at the high level, sample the second command address odd signal according to the first enabling odd signal and the second enabling odd signal to obtain the target address signal.

10. A semiconductor memory comprising the signal sampling circuit according to claim 8.

* * * * *